United States Patent
Azenkot et al.

(10) Patent No.: US 9,281,825 B2
(45) Date of Patent: *Mar. 8, 2016

(54) FREQUENCY SYNTHESIS WITH GAPPER AND MULTI-MODULUS DIVIDER

(71) Applicant: Applied Micro Circuits Corporation, Sunnyvale, CA (US)

(72) Inventors: Yehuda Azenkot, San Jose, CA (US); Michael Grosner, San Diego, CA (US); Timothy P. Walker, Boxford, MA (US)

(73) Assignee: Applied Micro Circuits Corporation, Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/469,456

(22) Filed: Aug. 26, 2014

(65) Prior Publication Data

US 2014/0375364 A1     Dec. 25, 2014

Related U.S. Application Data

(62) Division of application No. 13/846,311, filed on Mar. 18, 2013, now Pat. No. 8,816,730.

(51) Int. Cl.
    H03L 7/06    (2006.01)

(52) U.S. Cl.
    CPC .................................. *H03L 7/06* (2013.01)

(58) Field of Classification Search
    CPC .......... H03L 7/0891; H03L 7/18; H03L 7/093; H03L 7/087; H03L 7/10
    USPC ................................................... 327/147–161
    See application file for complete search history.

(56) References Cited

U.S. PATENT DOCUMENTS

| | | | |
|---|---|---|---|
| 6,218,879 B1 * | 4/2001 | Kilpatrick | 327/217 |
| 6,566,921 B1 * | 5/2003 | Boerstler et al. | 327/156 |
| 7,893,736 B2 * | 2/2011 | Palmer et al. | 327/156 |
| 2006/0132202 A1 * | 6/2006 | Meltzer | 327/156 |
| 2010/0102877 A1 * | 4/2010 | Welland et al. | 327/551 |

* cited by examiner

*Primary Examiner* — Quan Tra

(57) ABSTRACT

Systems and methods for frequency synthesis using a gapper and a multi-modulus divider. A frequency synthesizer may comprise a gapper, a multi-modulus divider and a Phase Locked Loop (PLL). When a frequency of an output signal is intended to be greater than a corresponding input signal, a factor can be borrowed by the gapper from the divider to generate a rational divide ratio G that is greater 1 in order for the gapper to be capable of performing the division by G. The PLL is capable of multiplying a gapped signal output from the first integer divider and attenuating jitter from the gapped signal.

18 Claims, 14 Drawing Sheets

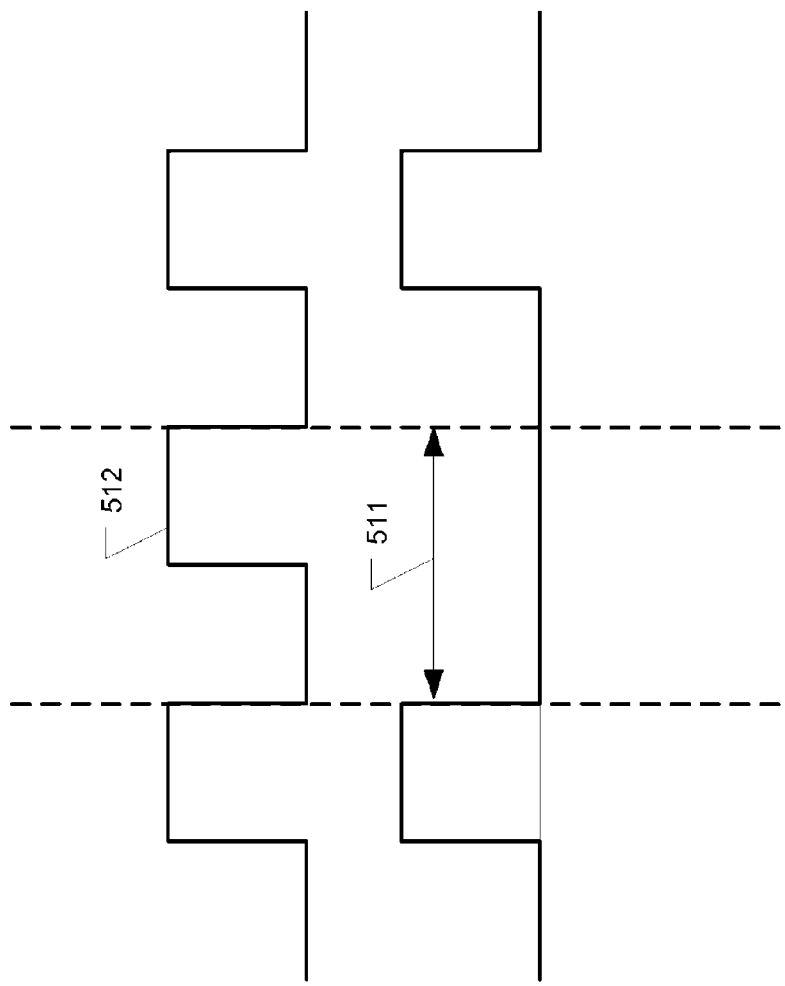

FREQUENCY SYNTHESIS WITH GAPPER AND MULTI-MODULUS DIVIDER

CROSS-REFERENCE TO RELATED APPLICATIONS

This application is a Divisional Application of and claims priority to U.S. patent application Ser. No. 13/846,311, filed on Mar. 18, 2013, titled "FREQUENCY SYNTHESIS WITH. GAPPER," by Azenkot, which is herein incorporated by reference.

TECHNICAL FIELD

The present disclosure relates generally to the field of electronics, and, more specifically, to the field of frequency synthesis.

BACKGROUND

Gapped signals are widely used in Optical Transport Network (OTN), broadcast video as well as many other application areas. One of the key requirements of an OTN is to insert plesiochronous payloads into an OTN wrapper. That is, because the data transmission rate and the rate of the payload source may not be exactly the same, they may drift with respect to one another. One approach to solve the issue to is to generate a reference clock with missing clock edges (or gaps) to keep the incoming and outgoing data rates synchronized.

A gapped signal by its nature carries significant amount of jitter, which usually is not tolerated by the downstream consumer circuitry. A jitter attenuating Phase Locked Loop (PLL) is typically used to create an output signal that has the same average frequency as the gapped signal with the jitter component attenuated. When the jitter component is interspersed in the gapped signal at a relatively high frequency, it can be effectively attenuated by the PLL. In addition, jitter with short durations can be removed more easily than those with long periods.

A frequency synthesizer may utilize a gapper and a jitter attenuating PLL to receive an input signal with frequency $f_i$ and generate an output signal with frequency $f_o$, where $D=1/R=f_i/f_o$ is usually a rational number. By virtue of the gapping operations, the average frequency of the gapped signal is lower than the corresponding input signal. Hence conventionally, frequency synthesizers that employ gappers are limited to applications that require D>1 (or R<1). This is disadvantageous in the applications where a higher frequency of output signal than the input signal is needed. For example, a clock signal transmitting from STS-192 to OTU2 needs to change from a frequency of 622.08 MHz to a frequency of 669.326 MHz.

SUMMARY OF THE INVENTION

Therefore, it would also be advantageous to provide a mechanism for a gapper-based frequency synthesizer to generate an output signal with higher frequency than a corresponding input signal.

According to one embodiment, an integrated circuit for frequency synthesis is described and includes a gapper configured to generate a first gapped signal based on an input signal, the gapper having a gapping unit configured to generate said first gapped signal that includes an equivalent of Q pulses responsive to P pulses of said input signal in accordance with gapping control signals, where P is greater than or equal to Q. The integrated circuit further includes a frequency divider coupled with said gapper and configured to receive the first gapped signal and generate a second gapped signal, a phase locked loop (PLL) configured to receive the second gapped signal and generate an output signal. If a frequency ratio of said input signal to the output signal is less than 1, the gapper is configured to incorporate a factor that is greater than 1 from said frequency divider, where said frequency divider is a multi-modulus divider configured to divide said input signal with a sequence of divide ratios, wherein an average of the divide ratios is approximately equal to P/Q, and wherein said sequence of divide ratio are converted from said plurality of gapping control signals.

In another described embodiment, a method of frequency synthesis is described and involves receiving an input signal at a multi-modulus divider, generating a first gapped signal based on the input signal, dividing the first gapped signal with a first divide ratio to generate a second gapped signal, and generating an output signal based on the second gapped signal. Generating the output signal is achieved by setting a value of a first register to zero and setting a value of a second register to P−Q, wherein the first gapped signal comprises an equivalent of Q pulses corresponding to P pulses in the input signal, wherein P and Q are integers and P is greater than Q, updating a value of the first register using the second gapped signal, and detecting an overflow in the updated value. If the overflow is less than Q, a control value Y is set to 0. If the overflow is greater than or equal to Q, the control value Y is set to a divide value greater than 0. Y is incremented by 1 and the clock signal is divided by Y to generate an output signal having at least a portion of at least one pulse removed.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying drawing figures in which like reference characters designate like elements and in which:

FIG. 5A illustrates a gapped signal generated by removing a full pulse from an input clock in accordance with an embodiment of the present disclosure.

DETAILED DESCRIPTION

Figure 1:
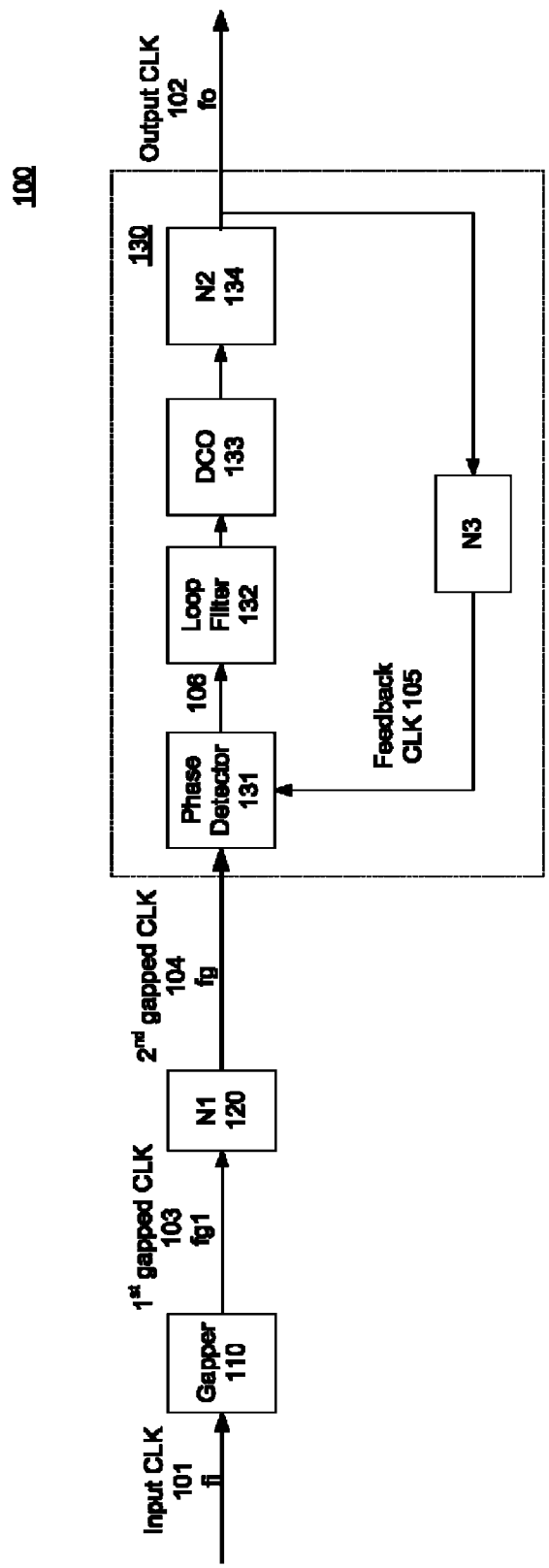
FIG. 1 illustrates an exemplary configuration of a versatile frequency synthesizer that employs a gapper and has the versatility of producing output signals with higher or lower frequency than corresponding input signals in accordance with an embodiment of the present disclosure.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. Although a method may be depicted as a sequence of numbered steps for clarity, the numbering does not necessarily dictate the order of the steps. It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Method and Apparatus for Gapping

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

FIG. 1 illustrates an exemplary configuration of a versatile frequency synthesizer 100 that employs a gapper 110 and has the versatility of producing output signals with higher or lower frequency than corresponding input signals in accordance with an embodiment of the present disclosure. In the illustrated embodiment, the frequency synthesizer 100 comprises a gapper 110, a PLL 130, and a first integer divider 120 coupled between the gapper 110 and the PLL 130. The first integer divider 120 has an integer divide ratio of N1. The PLL 130 comprises a phase detector 131 coupled with a loop filter 132, a Digital-Controlled Oscillator (DCO) 133 and coupled with the loop filter 132, a second integer divider 134 with an integer divide ratio of N2 coupled with the DCO 133. The second integer divider operates to generate an output signal 102 of the frequency synthesizer 100. The PLL also comprises a third integer divider 135 with an integer divide ratio of N3 and disposed in the feedback loop. In some embodiments, the DCO 133 can be substituted with a Voltage-Controlled Oscillator (VCO).

During operation, the input CLK 101 with frequency $f_i$ is provided as an input of the frequency synthesizer 100. In response to the input CLK 101, the gapper 110 can generate a first gapped signal 103 with a frequency of $f_{g1} = f_i/G$, where G can be a rational number presented as a ratio of two integers P/Q.

Due to the nature of the gapper, its frequency ratio G is typically greater than or equal to 1. If the application requires the frequency ratio $$D\left(=\frac{1}{R}=\frac{f_i}{f_o}\right)$$

of the frequency synthesizer 100 to be greater than 1, the gapper 101 can generate a gapped CLK 103 with an average frequency equivalent to the desired frequency of the output CLK 102. In other words, G can be configured to be equal to the intended frequency ratio $D=f_i/f_o$ of the frequency synthesizer 100. In some of such embodiments, this can be implemented by configuring the gapper 101 with appropriate P and Q values, as will be discussed in details in the following. For example, in a case that the frequency synthesizer 100 is used to convert the input CLK 101 with a frequency of 669.326 MHz to an output CLK 102 with a frequency of 622.08 MHz, P=255 and Q=237 can be chosen to configure the G ratio. However, in some other embodiments, the frequency of the gapped CLK 103 can be controlled by any other suitable means.

Corresponding to the G ratio configuration of the gapper 110, the integer divide ratios, namely N1, N2 and N3, can be selected such that gapped CLK 103 is forwarded to the output CLK without effective frequency change, i.e., $f_{g1}=f_o$. The combination of the first integer divider 120 and the PLL 130 only effects to remove jitter component from the gapped CLK 103. In some embodiments, N1, N2 and N3 are all equal, for instance, to 16 to address the case above.

In some other embodiments, the G ratio is configured such that the average frequency of the gapped CLK 103 $f_{g1}$ is not equal to, but rather, for instance, less than the desired output frequency $f_o$. Then the integer divide ratios, namely N1, N2 and N3, can be selected to compensate the average frequency of the gapped CLK 103, e.g., with a division or multiplication factor, to obtain the targeted output frequency $f_o$.

On the other hand, in the applications that the frequency synthesizer 100 is used to generate an output CLK 102 with a higher frequency than an input CLK 101, i.e. $f_1 \leq f_o$, the gapper 101 is allowed to incorporate a portion of the divide ratio N1 from the first integer divider to generate a G that is greater than 1. Correspondingly, N1, N2 and N3, can be configured such that the average frequency of the gapped CLK 103 $f_{g1}$ is compensated, e.g. with a division or multiplication factor, to ensure the output CLK 102 has the desired output frequency $f_o$.

For example, the frequency synthesizer 100 can be used to generate an output CLK $f_o$=669.326 MHz from an input CLK with $f_i$=622.08 MHz. The required frequency ratio D=237/255 is less than 1. A factor N1a=2 can be borrowed by the gapper 110 from N1 to generate a rational divide ratio G that is greater 1 in order for the gapper to be capable of performing the division by G. That is, P=474 and Q=255 can be chosen to configure the G ratio of the gapper 110. i.e.

$$G = \frac{P}{Q} = 2 \times \frac{237}{255} = \frac{474}{255}$$

Thus, the first gapped CLK 103 has an average frequency equal to the $f_o$/N1a. In some embodiments, the frequency of the gapped CLK 103 can be controlled with any other suitable means.

Taking into account the borrowing operation, the first integer divider 120 divides the first gapped CLK 103 with a reduced divide ratio N1b, where N1=N1a×N1b. N2 and N3 are selected such that the PLL 130 operates to multiply the second gapped CLK 104 with a factor equal to N3. For example, N1=N2=N3=16, N1a=2 and N1b=8 in this case.

Therefore, the frequency synthesizer 100 can advantageously achieve a frequency ratio $$D = \frac{1}{R} = \frac{f_i}{f_o}$$

that is either less or greater less than 1, despite the frequency ratio limitation (G≥1) of the associated gapper.

In the PLL 130, the frequency phase detector 131 can compare the frequency phase difference between the second gapped CLK 104 and the feedback CLK 105 and generate an error signal 106 based on the detected difference. The error signal 106 is forwarded to the DCO 133 through a low pass filter 132 and drives the DCO to generate an oscillated signal 104 with adjusted frequency. The second integer divider 134 divides the oscillated signal with divide ratio of N2 and generates an output CLK 102. The output CLK 102 is then divided by N3 and converted to the feedback CLK 105. At the output of the PLL 130, the output CLK 102 is produced with significantly reduced jitters and desired output frequency $f_o$.

Figure 2:
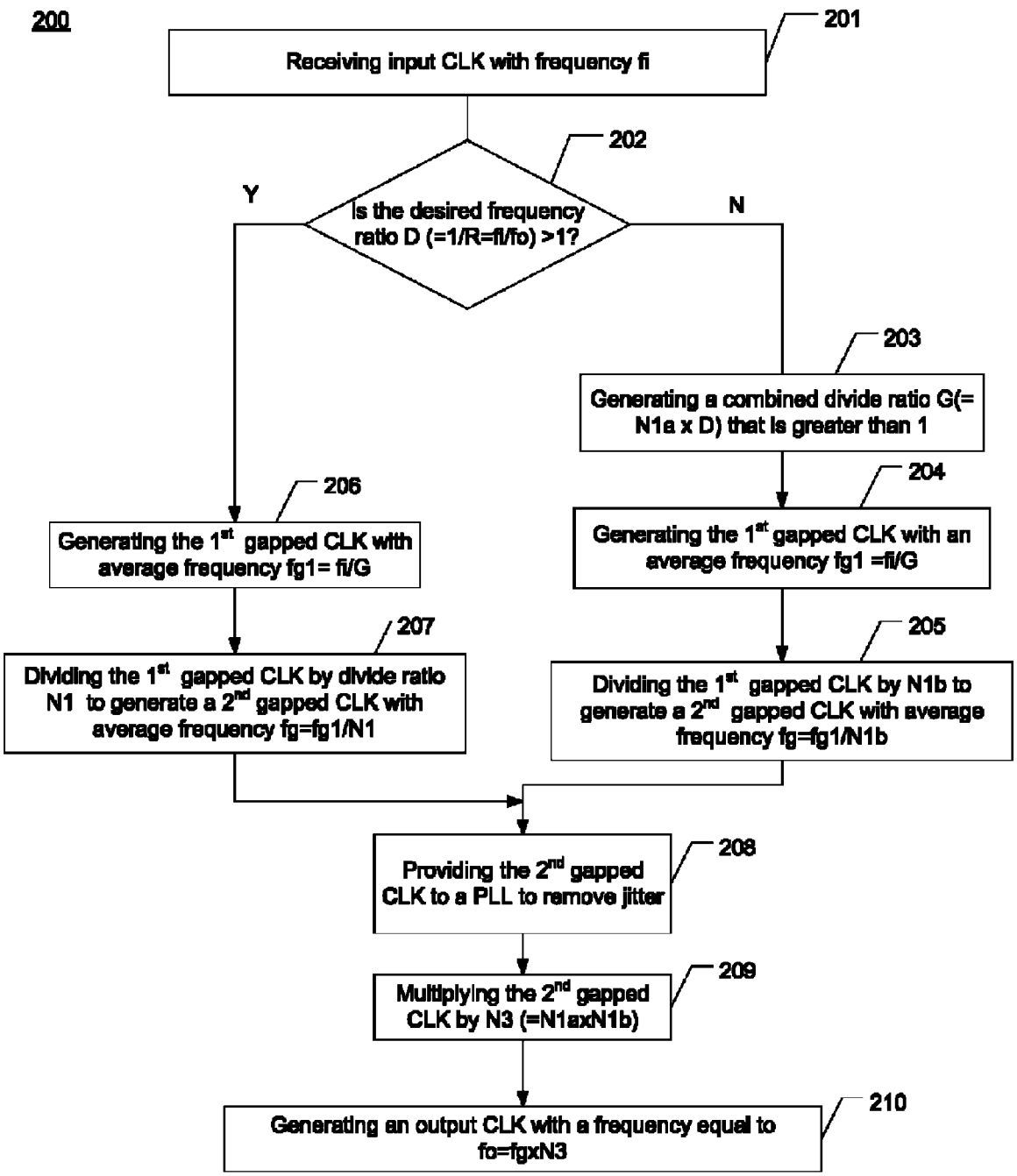
FIG. 2 is a flow diagram depicting an exemplary method of achieving an frequency ratio D that can be either greater or less than 1 by using a frequency synthesizer that comprises a gapper in accordance with an embodiment of the present disclosure.

FIG. 2 is a flow diagram depicting an exemplary method 200 of achieving an frequency ratio D that can be either greater or less than 1 by using a frequency synthesizer that comprises a gapper in accordance with an embodiment of the present disclosure. The referenced frequency synthesizer herein has a similar configuration as illustrated in FIG. 1. At 201, an input CLK with frequency $f_i$ is received. At 202, if it is determined the targeted output frequency is greater than the input frequency, i.e. $D=f_i/f_o<1$, a G ratio that is greater than 1 is generated by borrowing a factor N1a from the associated first integer divider (as illustrated in FIG. 1), at 203. In effect, G=N1a×D. At 204, a first gapped signal is generated by a gapper and has average frequency of $f_{g1}=f_i/G$. At 205, the first gapped signal is further divided by the first integer divide ratio that by a divide ratio N1b, where N1=N1a×N1b. Consequently, a second gapped clock can be generated by the first integer divider and has a frequency of $f_g=f_{g1}/N1b$.

The second gapped clock is then provided to the PLL to remove jitter at 208. The PLL is configured to multiply the second gapped clock by a factor equal to N3. At 209, the output clock with attenuated jitter is generated by the PLL at 210 and has a frequency equal to $$f_o = f_g \times N3.$$

On the other hand, if it is determined that the desired output frequency is less than the input frequency, i.e., $D=f_i/f_o>1$, at 202, the gapper may be configured to have a frequency ratio equal to D, i.e. G=D and $f_o=f_{g1}$ at 206. At 207, the first gapped CLK is divided by N1 to generate the second gapped CLK. The second gapped CLK with frequency of $f_g$ is then provided to a PLL and processed in accordance with blocks 208 to 210 as described above.

Figure 3:
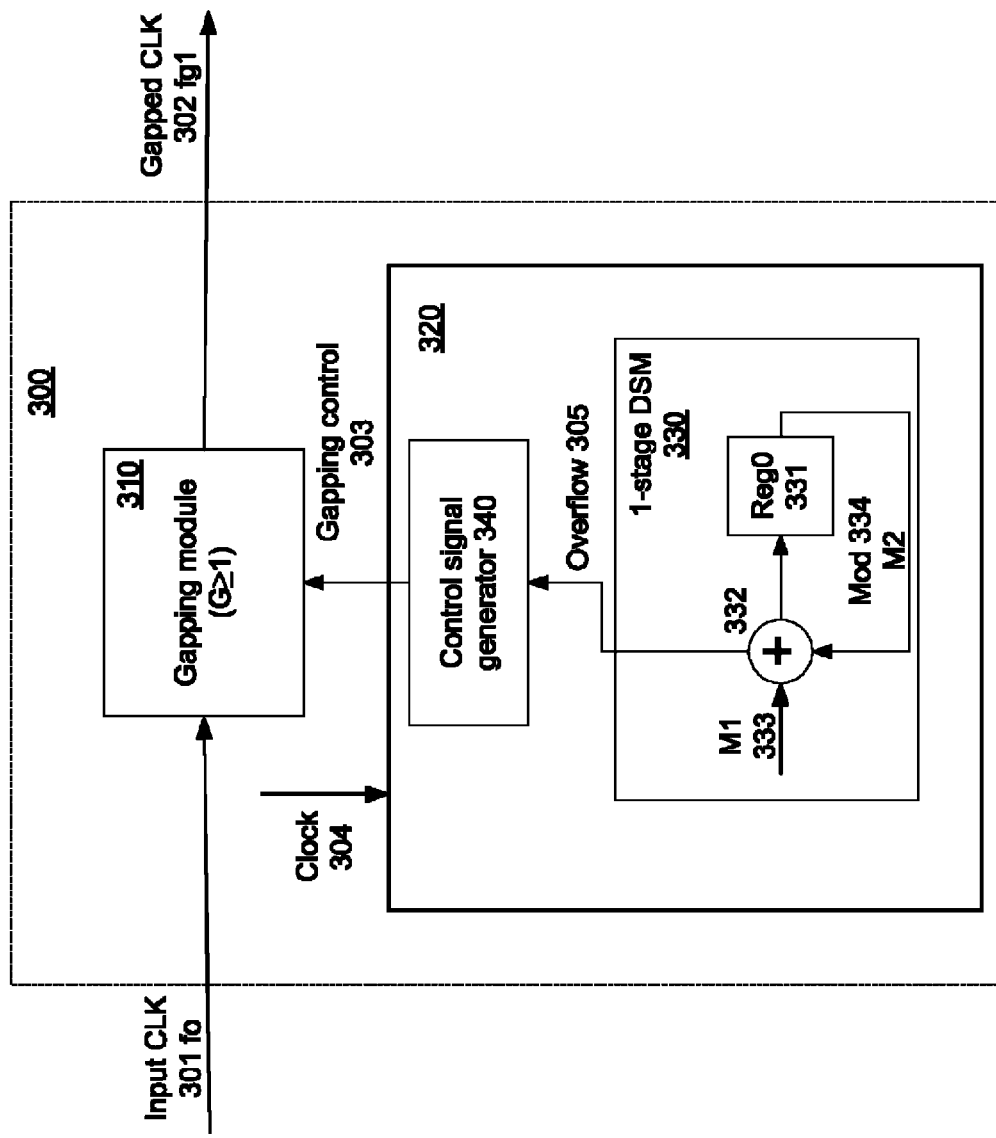
FIG. 3 illustrates an exemplary configuration of a gapper operable to generate a gapped clock with relatively evenly spread jitter based on an input signal in accordance with an embodiment of the present disclosure.

Because evenly spread jitter can be removed by a PLL efficiently, it is beneficial that gaps, or jitter, are interspersed evenly in the gapped signal. FIG. 3 illustrates an exemplary configuration of a gapper 300 operable to generate a gapped clock with relatively evenly spread jitter based on an input signal 301 in accordance with an embodiment of the present disclosure. The gapper 300 can be used in frequency synthesizers, such as the one illustrated in FIG. 1. In some embodiments, the input signal 301 may be a reference clock or a smooth clock.

The gapper 300 comprises a gapping module configured to receive the input CLK 301 with a frequency $f_i$ and to generate a gapped CLK 302 with an average frequency of $f_{g1}$. The gapper 300 further comprises a control module to generate gapping control signals 303 to control a pulse removal rate of the gapping module 310 according to the targeted G of the gapper 300. G can be represented as a division of two integers: P/Q and P is greater than Q. In the illustrated embodiment, the control module 320 comprises a 1-stage Delta Sigma Modulator (DSM) 330 coupled with control signal generator 340. The control module 320 includes a clock input to receive a clock signal 304. The DSM 330 comprises an adder 332, a modulo component (not explicitly shown), and a register Reg0 331 coupled with the adder 332 to store a stored value. In some embodiment, the modulo component can be combined with the adder 332.

Two numbers, namely M1 333 and M2 334, derived from P and Q and thereby reflecting the required G ratio are provided to the DSM 330 as configuration input. As G may be related to the frequency ratio of the frequency synthesizer ($D=1/R=f_i/f_o$) that uses the gapper, M1 and M2 may be functions of the D value as well. During each clock cycle, the adder 332 is operable to add M1 333 with the remainder of the value stored in Reg0 331 modulo M2 332 and generate a new value to be stored in the Reg0 331. Whenever an overflow is generated as a result of an adding operation, the overflow value is provided to the control signal generator 340 and converted to a gapping control signal 303 that is supplied to the gapping module 310. In response to a gapping control signal 303, the gapping module 310 can operate to remove at least a portion of a pulse from the input CLK 301.

Figure 4:
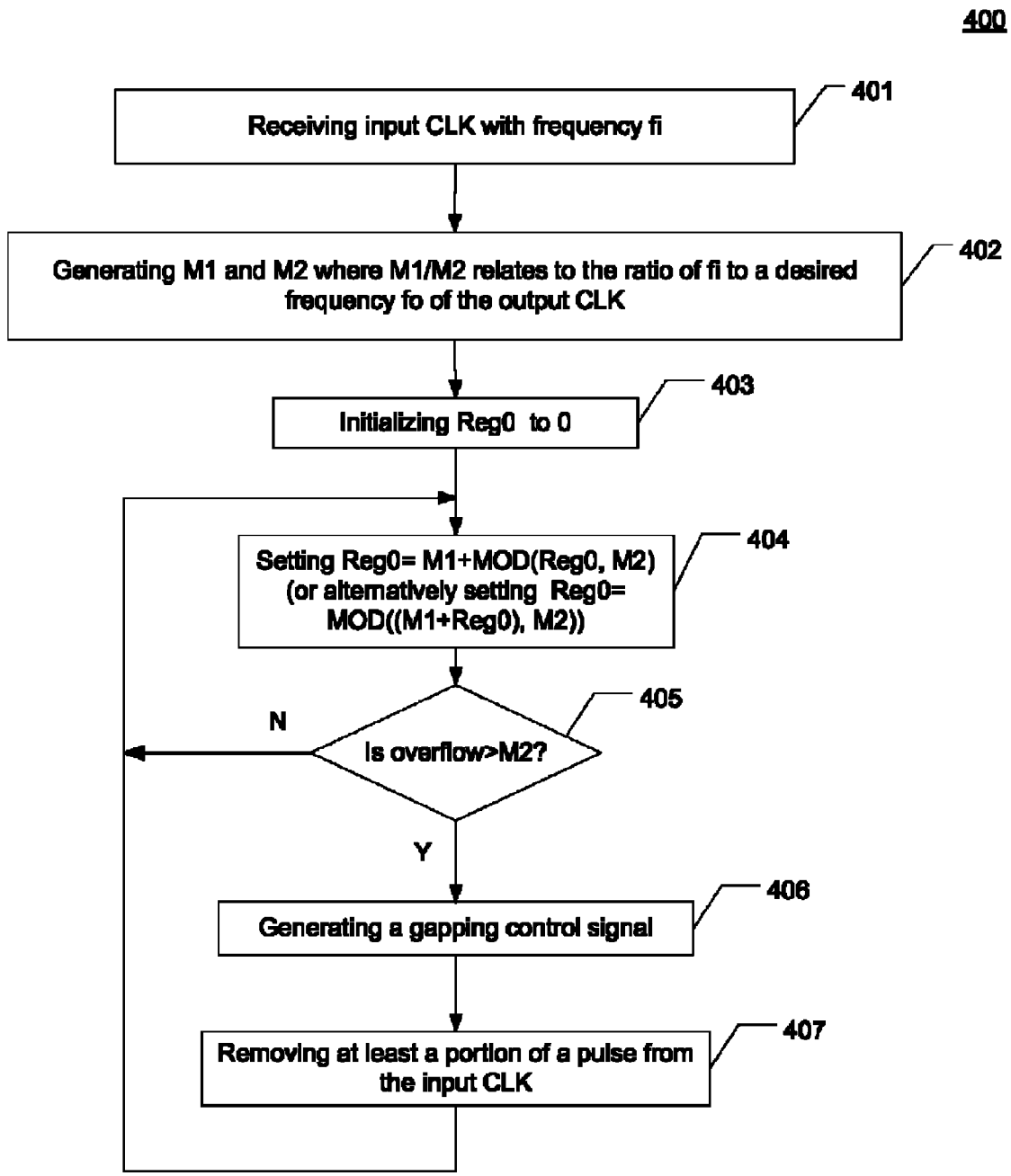
FIG. 4 illustrates an exemplary method of generating a gapped clock using a gapper that comprises a DSM in accordance with an embodiment of the present disclosure.

FIG. 4 illustrates an exemplary method 400 of generating a gapped clock using a gapper that comprises a DSM in accordance with an embodiment of the present disclosure. The gapper referenced herein has a similar configuration with FIG. 3. At 401, an input CLK with a frequency $f_i$ is received by the gapper. At 402, M1 and M2 can be generated. M1 and M2 may be derived from P and Q and so related to the targeted frequency ratio of the gapper (G) as well as the associated frequency synthesizer (D), as discussed above. At 403, Reg0 can be initialized to 0. At 404, a remainder of Reg0 modulo M2 can be derived and added with M1 to generated a new value as Reg0, expressed as Reg0=M1+MOD(Reg0,M2).

Upon detection of an overflow at 405 resulted from the above operations, the overflow value is compared with M2 at 405. If the overflow is greater than M2, a gapping control signal can be generated at 406, a gap is generated from the input CLK at 407 as at least a portion of a pulse is removed from the input CLK. In each clock cycle, the foregoing operations 404 to 407 are repeated.

For purposes of implementing this disclosure, generating gapping control signals by using a DSM that has a similar configuration with FIG. 3 is not limited to any particular formula. For example, in some other embodiments, during each clock cycle, the adder performs (M1+Reg0) first, and the register Reg0 in the DSM is updated with a new value Reg0=MOD((M1+Reg0),M2) as generated by the modulo component. An overflow may generated accordingly.

As an overflow can be resulted in a relatively high frequency using method 400, gaps can be generated at least in the same frequent, which means the resultant gapped CLK advantageously has evenly spread jitter that can be efficiently removed by a downstream PLL in accordance with the present disclosure.

Figure 5B:
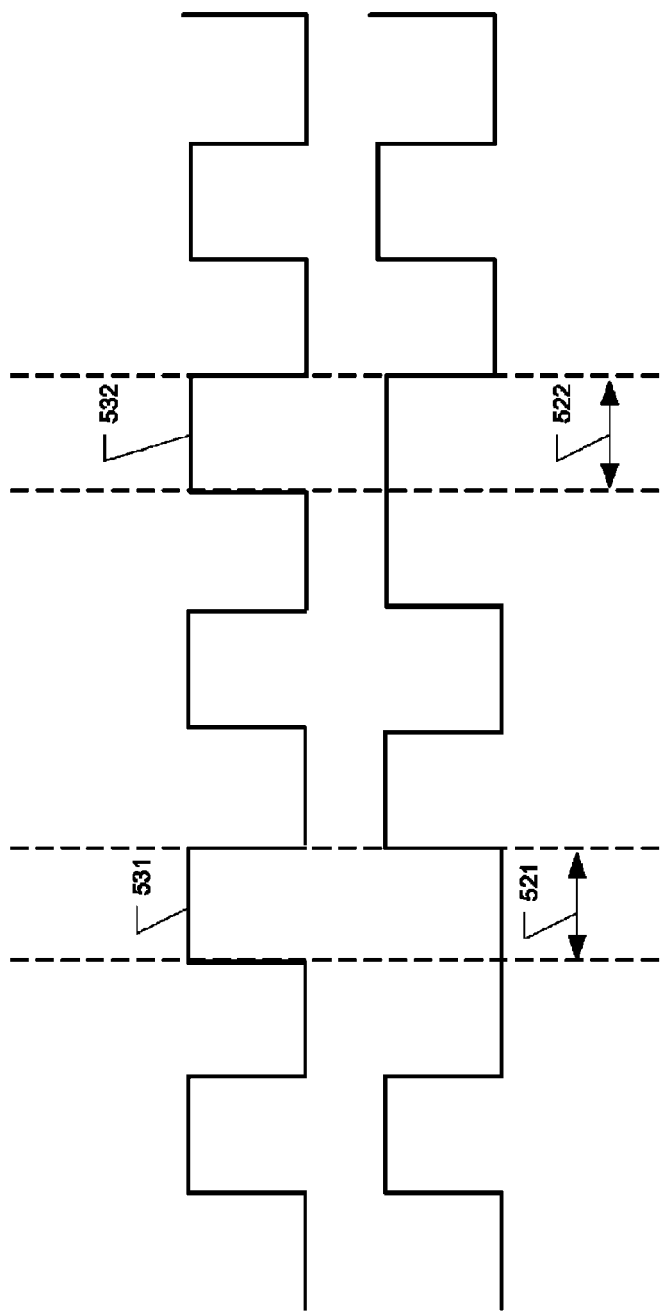
FIG. 5B illustrates two gaps generated by removing two half pulse from two input clocks respectively in accordance with an embodiment of the present disclosure.

During a clock cycle, the gapper can remove at least a portion of a pulse from the input CLK, such as ¼, ½, one or more full pulses, depending on the resolution configuration of the gapper. FIG. 5A illustrates a gapped signal generated by removing a full pulse 511 from an input clock 512 in accordance with an embodiment of the present disclosure. In contrast, FIG. 5B illustrates two gaps, 521 and 522, generated by removing two half pulse from two input clocks, 531 and 532, respectively in accordance with an embodiment of the present disclosure. Smaller gaps constitute smaller jitter that can be attenuated more easily. As to be discussed in the following, by properly selecting values of M1 and M2, finer resolution can be advantageously achieved in accordance with the present disclosure.

The function of generating gaps in a signal can be implemented using a variety of mechanisms. The present disclosure is not limited to any particular gapping implementation. In some embodiments, the gapping module may essentially comprise a gapping circuit configured to remove pulses from an input signal. In some other embodiments, the gapping module may comprise one or more dividers configured to generate gaps by modifying width of respective pulses in an input signal.

Figure 6A:
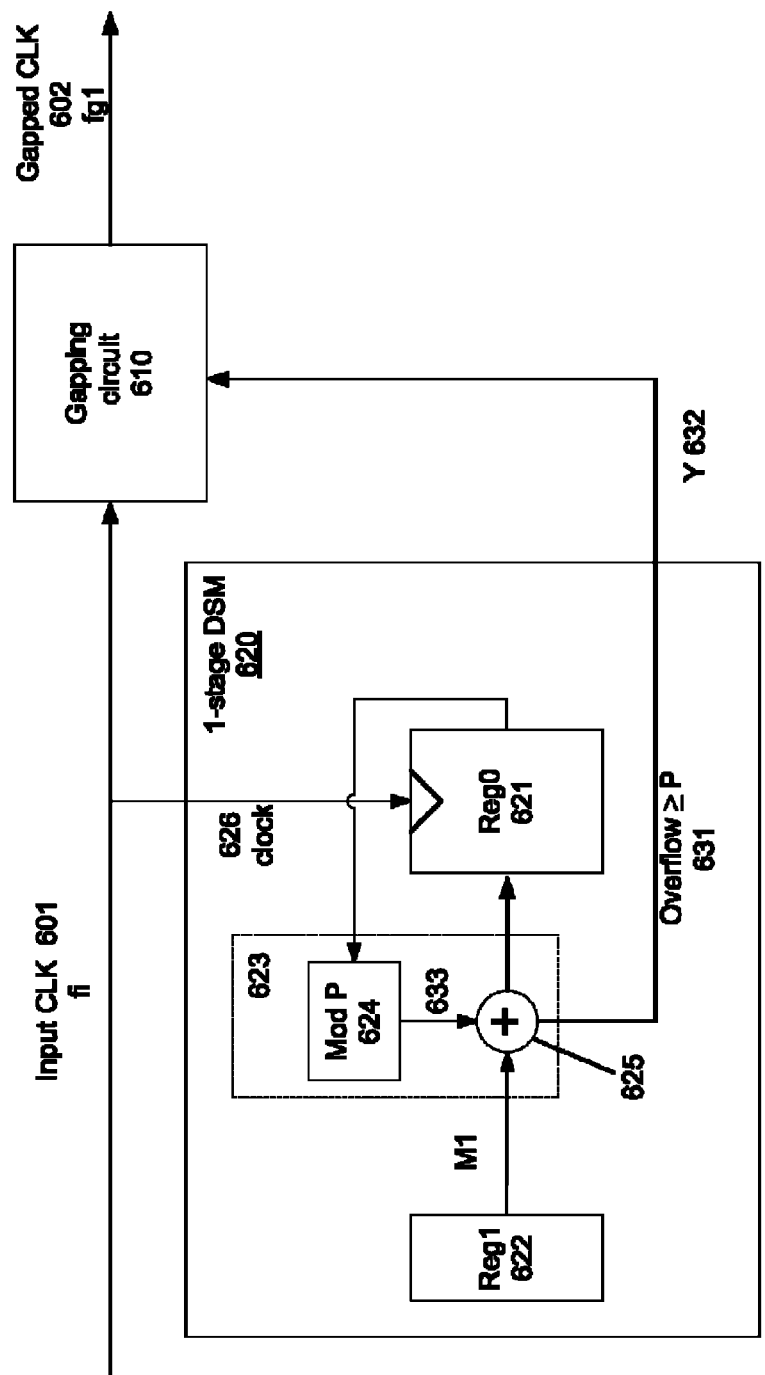
FIG. 6A illustrates an exemplary configuration of a gapper that comprises a gapping circuit in the gapping module in accordance with an embodiment of the present disclosure.

FIG. 6A illustrates an exemplary configuration of a gapper 600 that comprises a gapping circuit 610 in the gapping module in accordance with an embodiment of the present disclosure. The gapping circuit is configured to receive the input CLK 601 with frequency $f_i$, and output a gapped CLK 602 with average frequency equivalent to $f_{g1}$. The gapper 600 also comprises a 1-stage DSM 620 configured to generate gapping control signals Y 632 to control a rate of generating gaps by the gapping circuit 610.

The 1-stage DSM 620 comprises a clock input 626 configured to receive a clock signal, a first register Reg0 621 used for storing Reg0 value, a second register Reg1 622 used for storing a preset number M1, a modulo component 623, an adding component 625 coupled with Reg0 621 and Reg1 622. In the illustrated embodiment, the input CLK 601 serves as the clock signal supplied to Reg0 621. In some other embodiments, other suitable signals can be used as clock signal for Reg0 621. In some embodiments, the modulo component 624 is integrated with the adding component 625 in the adder 623.

In the illustrated embodiments, $$f_{g1} = f_i / \left(\frac{P}{Q}\right),$$

where P and Q are integer and P is greater than Q. Thus, for every P pulses received as the input signal, the gapper 600 is capable of generating an equivalent of Q pulses by removing (P−Q) pulses.

In the illustrated embodiments, the pulse removal resolution of the gapper 600 adjustable with M1 value. In some embodiments, M1 is set to K(P−Q), where K is a positive integer, e.g. 1, 2, 3, . . . . In response to a gapping control signal 632, the gapping circuit can remove a 1/K portion of a pulse. For example, when K is equal to 1, the gapper can remove a full pulse from the input CLK 601, as shown in FIG. 5A. When K is equal to 2, the gapper is capable of removing a half pulse as shown in FIG. 5B. However, in some embodiments, regardless of the different resolution adopted, the gapper can remove an equivalent of Q pulses from a window of P pulses in the input CLK, and thus has a frequency ratio of P/Q.

According to the illustrated embodiment, during a clock cycle, the modulo component 624 can read the stored value in Reg0 621 and perform Reg0 modulo P. The remainder 633 of the modulo operation is added with M1 in the adding component 625, the result of which is supplied to Reg0 621 to update the value stored therein.

Whenever an overflow occurs as a result of the above operations in a certain cycle, the overflow value can be compared with P. The result of the comparison is converted to a gapping control signal Y 632 that is used to control the gapping circuit 610 to remove a 1/K portion of a pulse.

In some other embodiments, during a clock cycle, the adder 625 performs adding (P−Q) with Reg0 and provides the result to the modulo component 624 to perform modulo P. The remainder of MOD(((M1+Reg0), M2) is then provided to update Reg0 621. At its output, the modulo component can also provide an overflow Y 632 to the gapping circuit 610.

Figure 6B:
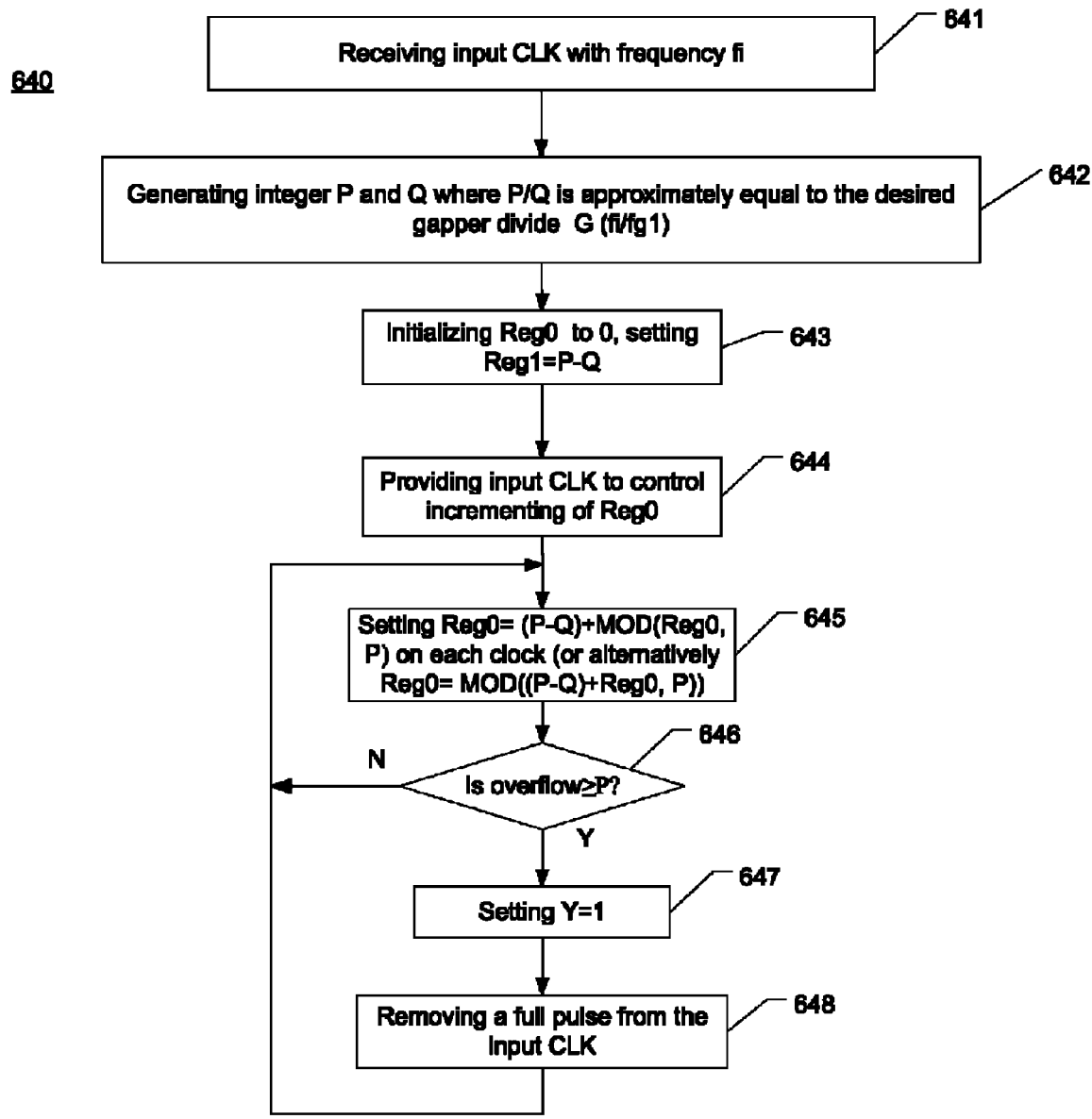
FIG. 6B is a flow diagram depicting an exemplary method of removing a full pulse in response to a gapping control signal using a gapper that has a similar configuration with FIG. 6A.

FIG. 6B is a flow diagram depicting an exemplary method 640 of removing a full pulse in response to a gapping control signal using a gapper that has a similar configuration with FIG. 6A. At 641, the input CLK with frequency $f_i$ is received. P and Q are generated based on the intended frequency ratio G of the gapper, where $$G=P/Q=f_i/f_{g1}.$$

Reg0 is initialized to 0 and Reg1 is initialized to (P−Q) at 643. A clock signal is provided to control incrementing of Reg0 value at 644. In this embodiment, Reg0 is incremented by the input CLK. During each clock cycle of the clock signal, at 645, Reg0 is updated with a new value:

$$\text{MOD}\left(\frac{Reg0}{P}\right) + (P-Q).$$

In some other embodiments, Reg0 is updated with MOD(((P−Q)+Reg0),P). If an overflow is detected, compare the overflow with P at 646. If the overflow is greater than P during a certain clock cycle, a gapping control signal Y=1 is generated at 647. In response to Y, a full pulse is removed from the input CLK in this clock cycle. For each clock cycle, the foregoing steps 645-648 are repeated.

Referring to FIG. 6A and FIG. 6B. For example, $f_i$ is 622.08 MHz, and targeted $f_{g1}$ is 334.663 MHz. As described above with reference to FIG. 1 and FIG. 2, $f_{g1}$ may be derived from an output frequency, e.g. $f_o$=669.326 MHz, of an associated frequency synthesizer. To obtain this gapper frequency ratio G=622.08/334.663, P can be set to 474 and Q can be set to 255. Reg1 can be set to P−Q=219. The adder performs 219+MOD(Reg0, 471) in each clock cycle. Whenever there is an overflow, the DSM can output Y=1 which controls the gapping circuit to remove a full pulse from the input CLK. Otherwise Y=0 and the gapping circuit can output the input CLK without modification. In a window of P=474 input pulses, P−Q=219 pulses are removed, which means the gapper output has Q pulses within a window of P pulses in the input CLK. Therefore, the gapper implements a frequency ration of P/Q.

Figure 6C:
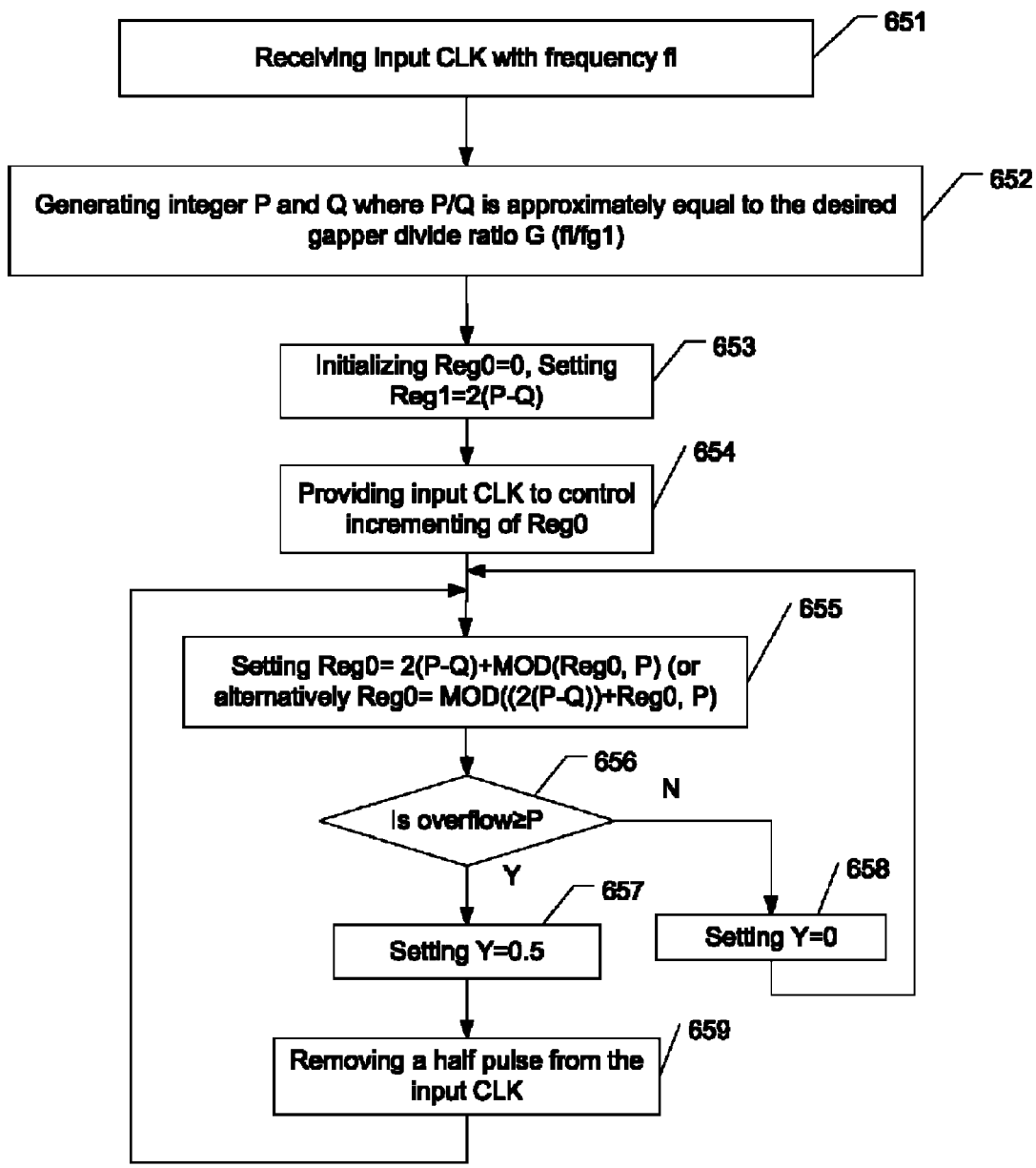
FIG. 6C is a flow diagram depicting an exemplary method of generating gapped signals by removing a half pulse in response to a gapping control signal using a gapper that has a similar configuration with FIG. 6A in accordance with an embodiment of the present disclosure.

FIG. 6C is a flow diagram depicting an exemplary method 650 of generating gapped signals by removing a half pulse in response to a gapping control signal using a gapper that has a similar configuration with FIG. 6A in accordance with an embodiment of the present disclosure. Steps 651-654 of method 650 are similar with Steps 641-644 of method 640 in FIG. 6B, except that at 653, Reg1 is initialized to 2(P−Q) for purposes of achieving a resolution of half pulse.

During each clock cycle of the clock signal, Reg0 is updated with a new value:

$$\text{MOD}\left(\frac{Reg0}{P}\right) + 2(P-Q).$$

In some other embodiments, the new Reg0 value can be MOD((2(P−Q)+Reg0), P). Reg0 is incremented by the input CLK. If an overflow is detected at 656, the overflow value is compared with P. If the overflow is greater than P during a certain clock cycle, a gapping control signal Y=0.5 can be generated at 647, and a half pulse is removed from the input CLK in this clock cycle at 659. Otherwise, Y can be set to 0 at 658 and no pulse is removed through the gapper. For each clock cycle, the foregoing steps 655-659 are repeated.

Referring to FIG. 6A and FIG. 6C. For example, $f_i$ is 622.08 MHz, and the targeted $f_{g1}$ is 334.663 MHz. Again, the $f_{g1}$ may be derived from an intended output frequency, e.g. $f_o$=669.326 MHz, of an associated frequency synthesizer. To obtain the gapper frequency ratio G=622.08/334.663, P can be set to 474 and Q can be set to 255. The register Reg1 can be initialized to 2(P−Q)=438. The adder performs 438+MOD (Reg,471) in each clock cycle. When there is an overflow, the DSM can output Y=0.5 and correspondingly the gapping circuit can remove a half pulse from the input CLK. Otherwise Y=0 and the gapping circuit can output the input CLK without modification. For every window of P=474 input pulses, method 650 enables removal of 2(P−Q) half pulses, which effectively is equivalent to (P−Q)=219 full pulses. Thus the gapped signal has Q pulses within a window of P pulses of the input signal. Therefore, the gapper implements a frequency ratio of P/Q in accordance with method 650.

Figure 7A:
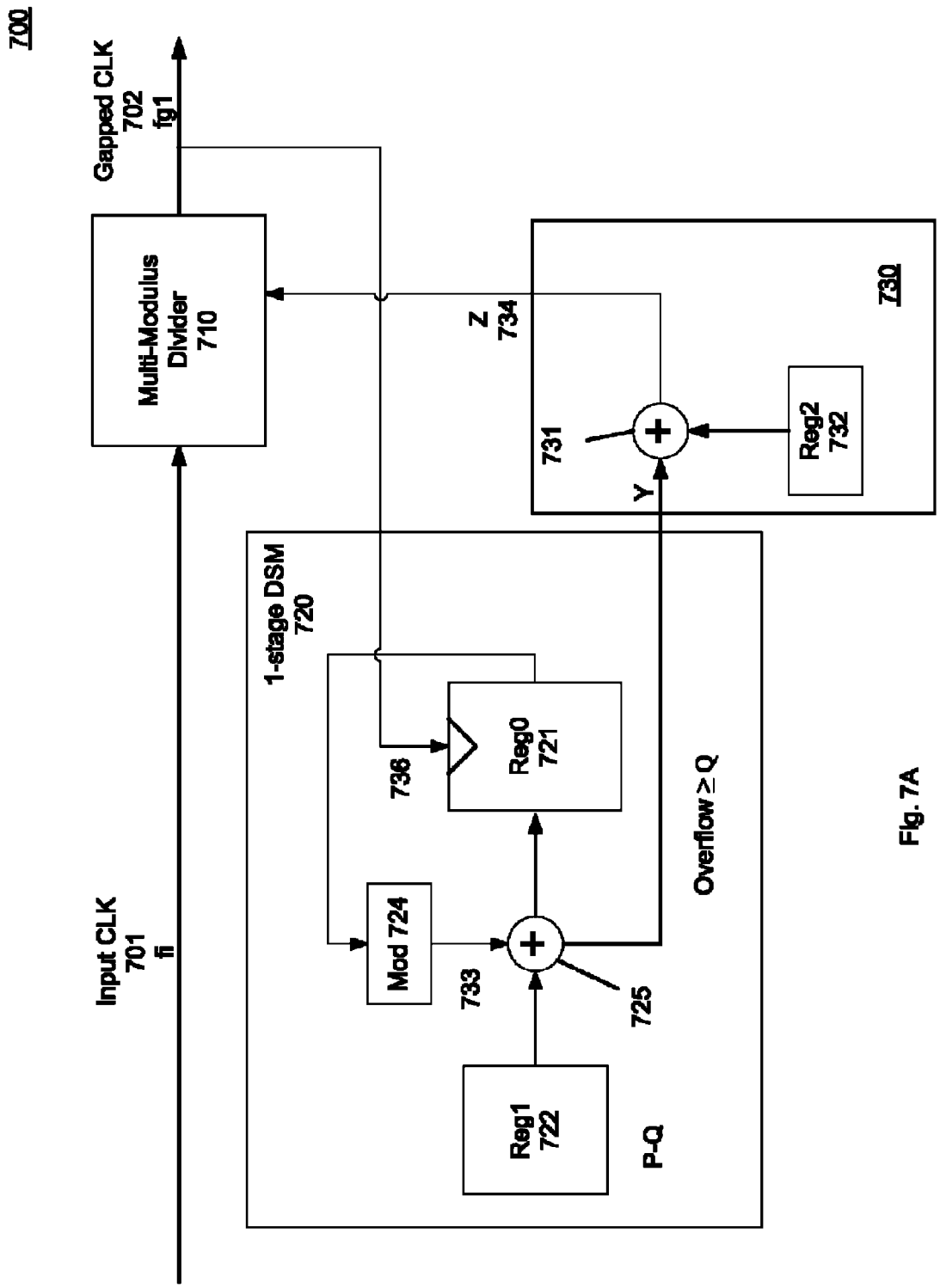
FIG. 7A illustrates an exemplary configuration of a gapper that comprises a multi-modulus divider having a pulse removal resolution of a full pulse in accordance with an embodiment of the present disclosure.

FIG. 7A illustrates an exemplary configuration of a gapper 700 that comprises a multi-modulus divider 710 having a pulse removal resolution of a full pulse in accordance with an embodiment of the present disclosure. The multi-modulus divider 710 is configured to receive the input CLK 701 with frequency $f_i$, and output a gapped CLK 702 with average frequency equivalent to $f_{g1}$. The gapper 700 also comprises a 1-stage DSM 720 coupled with a control signal generator 730, the combination of which are configured to generate gapping control signals Z 734 to control a rate of gap generation by the multi-modulus divider 710. In some embodiments, Z value can be coincident to a divide ratio of the multi-modulus divider 710.

For purposes of practicing this disclosure, the implementation of a multi-modulus divider is not limited to any particular mechanism or configuration. In the illustrated embodiment, the 1-stage DSM 720 comprises a clock input 736 configured to receive a clock signal, a first register Reg0 721 used for storing a Reg0 value, a second register Reg1 722 used for storing a preset number P−Q, a modulo component 724, an adding component 725 coupled with Reg0 721 and Reg1 722. The gapper comprises a control signal generator 730 that comprises an adder 731 and a register 732. In the illustrated embodiment, the gapped CLK 702 serves as the clock signal for the DSM 720 and is provided to Reg0 721. In some other embodiments, other suitable signals can be used as the clock signal. In some embodiments, the modulo component 724 is integrated with the adding component 725 in an adder.

In the illustrated embodiments, the gapped CLK 702 has an average frequency $$f_{g1} = f_i \Big/ \left(\frac{P}{Q}\right),$$

where P and Q are integer and P is greater than Q. For every P pulses received as the input signal, the gapper 700 is capable of outputting Q full pulses. During a clock cycle, the modulo component 724 can read the stored value in Reg0 721 and perform Reg0 modulo Q. The remainder 733 of the modulo operation is added with (P−Q) in the adding component 725 supplied to Reg0 721 to update the value stored therein.

Whenever an overflow is detected, the overflow is compared with Q. The result of the comparison is converted to Y which is used to calculate a gapping control signal Z in the control signal generator 730. The adder 731 is configured to generate a Z by adding Y with a value stored in Reg2. Z can be provided to the multi-modulus divider 710 to trigger a remove of a full pulse. In some embodiments, Reg2 732 Stores a constant, e.g., 1. By dividing the input CLK with two divide ratios according to Z values, the multi-modulus divider can effectively have a divide ratio equal to an average of the two divide ratios. In some other embodiments, there may be more than two divide ratios generated and used by the multi-modulus divider 710.

In some other embodiments, the modulo component can perform ((P−Q)+Reg0) modulo Q, and provide the remainder to update Reg0 as well as the overflow Y.

Figure 7B:
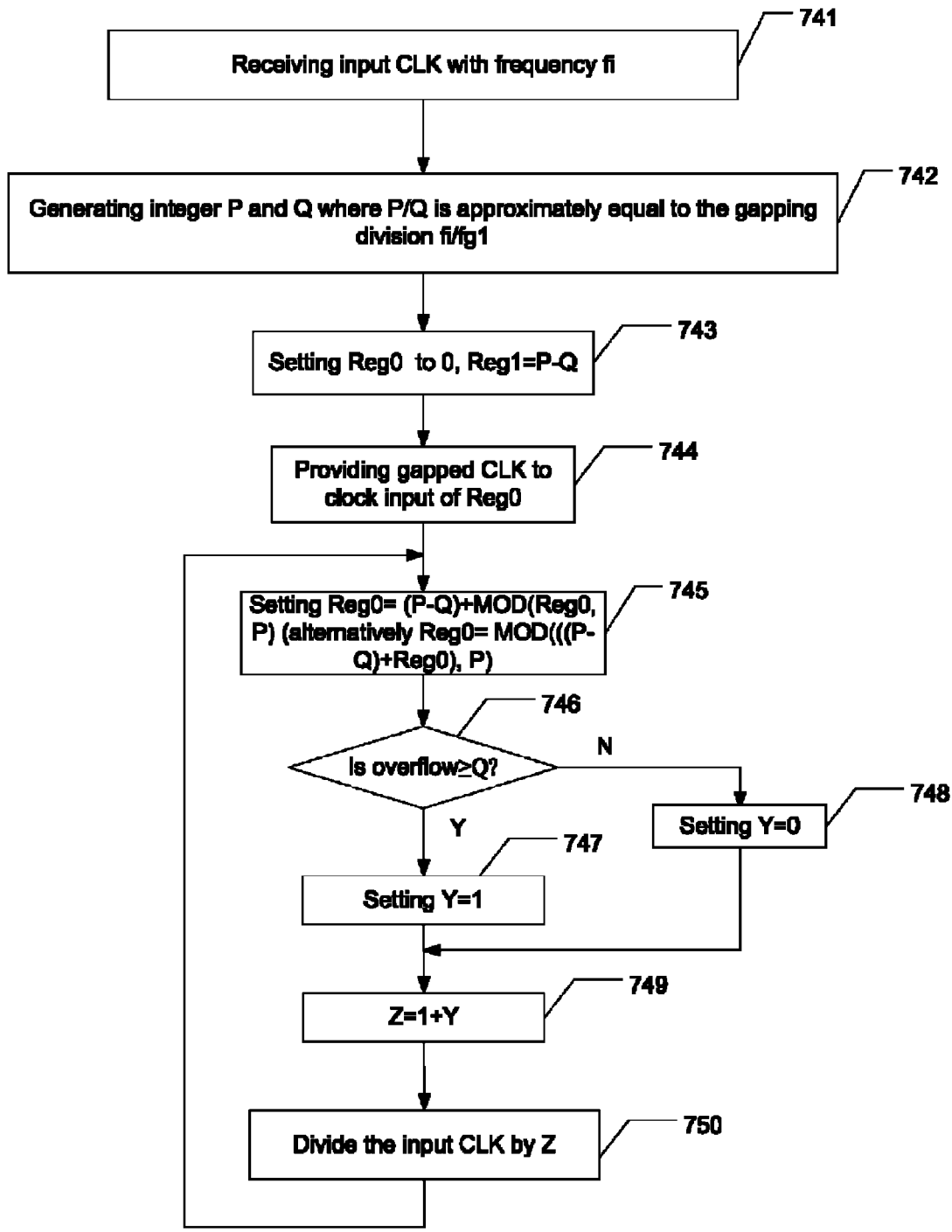
FIG. 7B is a flow diagram depicting an exemplary method of full pulse clock gapping using a gapper that has a similar configuration with FIG. 7A in accordance with an embodiment of the present disclosure.

FIG. 7B is a flow diagram depicting an exemplary method 740 of full pulse clock gapping using a gapper that has a similar configuration with FIG. 7A in accordance with an embodiment of the present disclosure. At 741, the input CLK with $f_i$ is received. At 742, P and Q are generated based on the desired divide ratio G of the gapper, where G=P/Q=Reg0 is initialized to 0 and Reg1 is set to (P−Q) at 743 and P>Q. The gapped CLK is provided as the clock signal to Reg0 at 744. During each clock cycle, Reg0 is updated with a new value to store $$(P-Q) + \text{MOD}\left(\frac{Reg0}{Q}\right)$$

at 745. If an overflow is detected, compare the overflow value with Q at 746. If the overflow is greater than Q during a certain clock cycle, Y is set to 1 at 747. Otherwise, Y=0 at 748. For each clock cycle, Z is set to 1+Y at 749 and used as the gapping control signal. At 750 the input CLK is divided by each Z generated and accordingly an output is generated. The foregoing steps 745-750 are repeated in each clock cycle. In some other embodiments, the register Reg0 can be updated with MOD(((P−Q)+Reg0), Q) during each clock cycle.

Referring to FIG. 7A and FIG. 7B. Using the same example, $f_i$ is 622.08 MHz, and $f_{g1}$ is 334.663 MHz. P can be set to 474 and Q can be set to 255. The register Reg1 can be initialized to P−Q=219. The adder performs modulo Q in each clock cycle. When there is an overflow in a certain clock cycle, set Y=1 and Z=2. The multi-modulus divider correspondingly divides the input CLK by 2 and so removes a full pulse from the input CLK as illustrated in FIG. 5A. Otherwise if Y=0 and Z=1, the multi-modulus divider is bypassed and outputs the input CLK without modification. In a window of Q=255 output pulses, the multi-modulus divider divides the input CLK 36 times by 1 and 255−36=219 times by 2. On average, the multi-modulus divider divides by 36×1+219× 2=1.8588, which is equal to P/Q=474/255=1.8588.

Figure 7C:
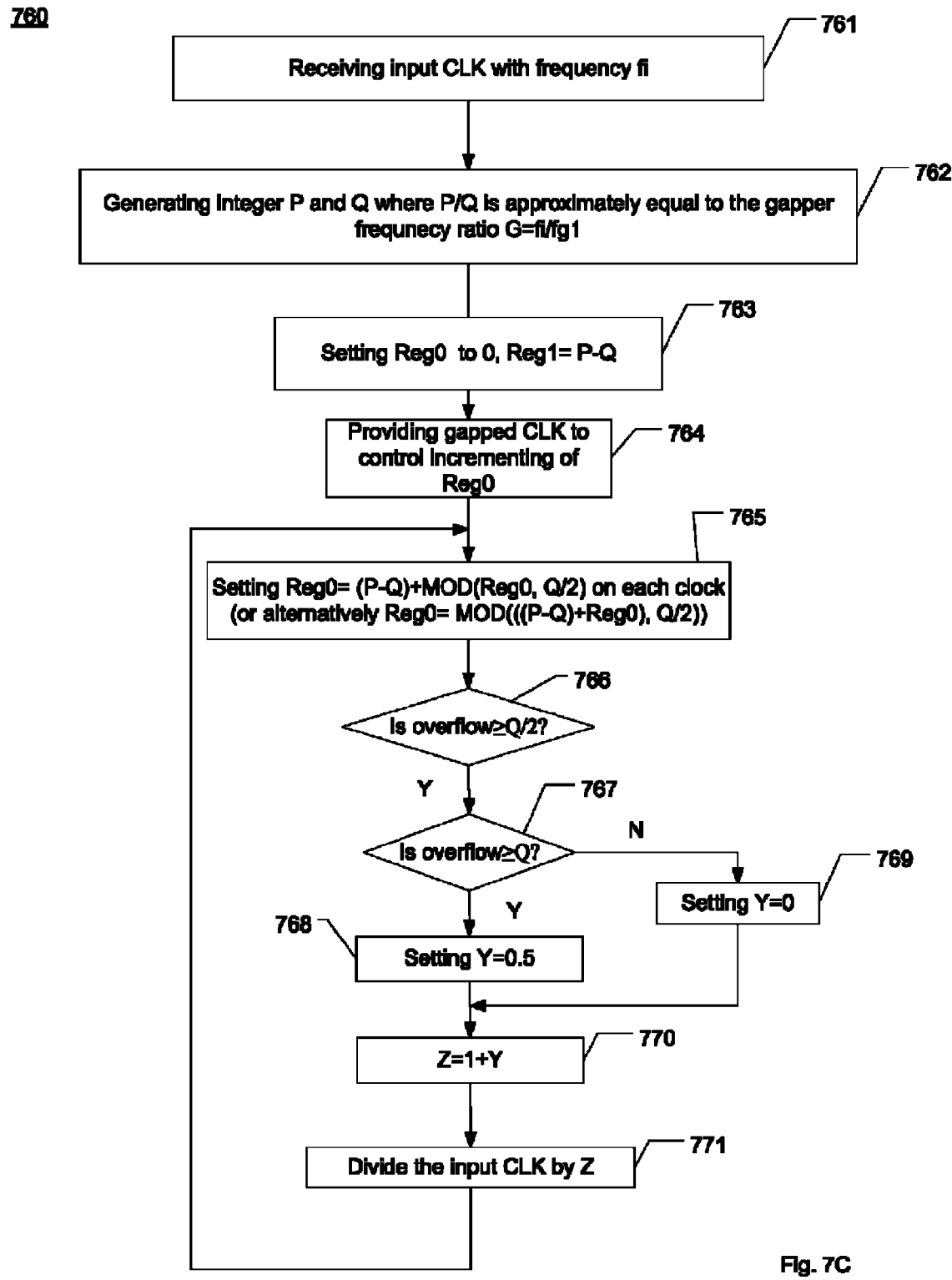
FIG. 7C is a flow diagram depicting an exemplary method of half clock gapping using a gapper that has a similar configuration with FIG. 7A.

FIG. 7C is a flow diagram depicting an exemplary method 760 of half clock gapping using a gapper that has a similar configuration with FIG. 7A. At 761, the input CLK with $f_i$ is received. P and Q are generated based on the desired frequency ratio G of the gapper at 762, i.e., G=P/Q=$f_i$/$f_{g1}$, where P>Q.

Reg0 is initialized to 0 and Reg1 is set to (P−Q) at 763. The gapped CLK is provided as the clock signal for incrementing Reg0 at 764. During each clock cycle of the clock signal, Reg0 is updated with a new value:

$$\text{MOD}\left(\frac{Reg0}{P}\right) + (P-Q)$$

at 745. If an overflow is detected, compare the overflow with Q/2 at 766 and further with Q at 767. If the overflow is greater than Q/2, Y is set to 0.5 at 768, but when the overflow is greater than Q, Y is set to 1 at 769. Reg2 is set to constant 1 in this embodiment. Thus, Z can be 1.5 or 2. During each clock cycle, a division by Z is performed in the multi-modulus divider 771. An average of Z over time is approximately equal to G. In some other embodiments, Reg0 can be updated with a new value: MOD(((P−Reg0), Q/2) during each clock cycle.

Referring to FIG. 7A and FIG. 7C. Using the same example, $f_i$ is 622.08 MHz, and $f_{g1}$ is 334.663 MHz. P can be set to 474 and Q can be set to 255. The register Reg1 can be initialized to P−Q=219. The adder performs modulo Q/2 in each clock cycle. When there is an overflow in a certain clock cycle and the overflow is greater than Q, set Y=0.5 and Z=1.5, and the input CLK is divided by 1.5. If the overflow is greater than Q, Y=1 and Z=2, and the input CLK is divided by 2. Consequently, in a window of Q=255 output pulses, the multi-modulus divider divides 36×2=72 times by 1.5 and 255−72=183 times by 2. On average, the multi-modulus divider divides by 72×1.5+183×2=1.8588, which is equal to P/Q=474/255=1.8588.

Figure 8A:
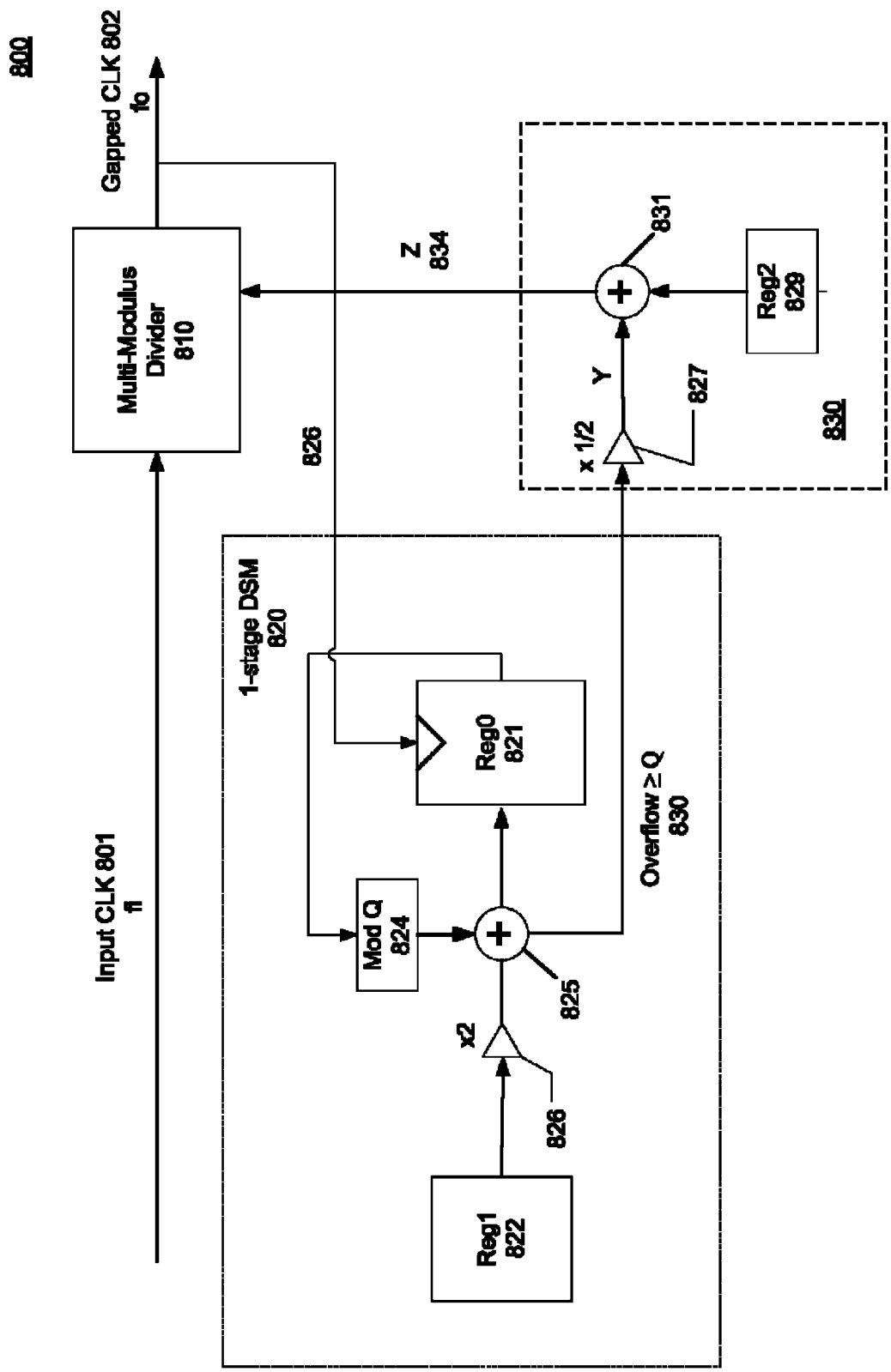
FIG. 8A illustrates another exemplary configuration of a gapper that comprises a multi-modulus divider having a resolution of a half pulse in accordance with an embodiment of the present disclosure.

FIG. 8A illustrates another exemplary configuration of a gapper 800 that comprises a multi-modulus divider 810 having a resolution of a half pulse in accordance with an embodiment of the present disclosure. The multi-modulus divider 810 is configured to receive the input CLK 801 with frequency $f_i$, and output a gapped CLK 802 with average frequency equivalent to $f_{g1}$. The gapper 800 also comprises a 1-stage DSM 820 coupled with a control signal generator 830, the combination of which are configured to generate gapping control signals Z 834 to control a rate of generating gaps by the multi-modulus divider 810, where Z values can be coincident to the divide ratios of the multi-modulus divider In the illustrated embodiment, the 1-stage DSM 820 comprises a clock input 826 configured to receive a clock signal, a first register Reg0 821 used for storing Reg0 value, a second register Reg1 822 used for storing a preset number M1 e.g., P−Q, a multiplication component 826 configured to multiply M1 by 2, an adder 825 and a modulo component 824. The gapper comprises a control generation module 830 that includes a multiplication component 827, an adder 831 and a register Reg2 829. In the illustrated embodiment, the gapped CLK 802 is used as the clock signal for incrementing Reg0 821.

In the illustrated embodiments, the gapped CLK has an average frequency $$f_{g1} = f_i / \left(\frac{P}{Q}\right),$$

where P and Q are integer and P is greater than Q. For every P pulses received as the input signal, the gapper 800 is capable of outputting an equivalent of Q full pulses by removing 2(P−Q) half pulses. During a clock cycle of the clock signal, the modulo component 824 can read the stored value in Reg0 821 and perform Reg0 modulo Q. The remainder 833 of the modulo operation is added with 2(P−Q) in the adding component 825 and supplied to Reg0 821 to update the value stored therein. In some other embodiments, the modulo component can perform (2(P−Q)+Reg0) modulo Q, and provide the remainder to update Reg0 as well as the overflow Y.

Whenever an overflow is detected as a result of the above operations, the overflow is compared with Q. The result of the comparison is converted to Y through the multiplication component 827. If an overflow is detected, the multiplication component 827 outputs a Y equals to ½. Otherwise, Y is equal to 0. The adder 831 is configured to add Y with the constant value, e.g. 1, stored in Reg2 to generate Z. Z is provided to the multi-modulus divider 810 to trigger a remove of a half pulse. In some embodiments, Reg2 832 stores a constant, e.g. 1. By dividing the input CLK with a sequence of divide ratios comprising 0.5 and 1, the multi-modulus divider 910 effectively can have an average divide ratio equal to G.

Figure 8B:
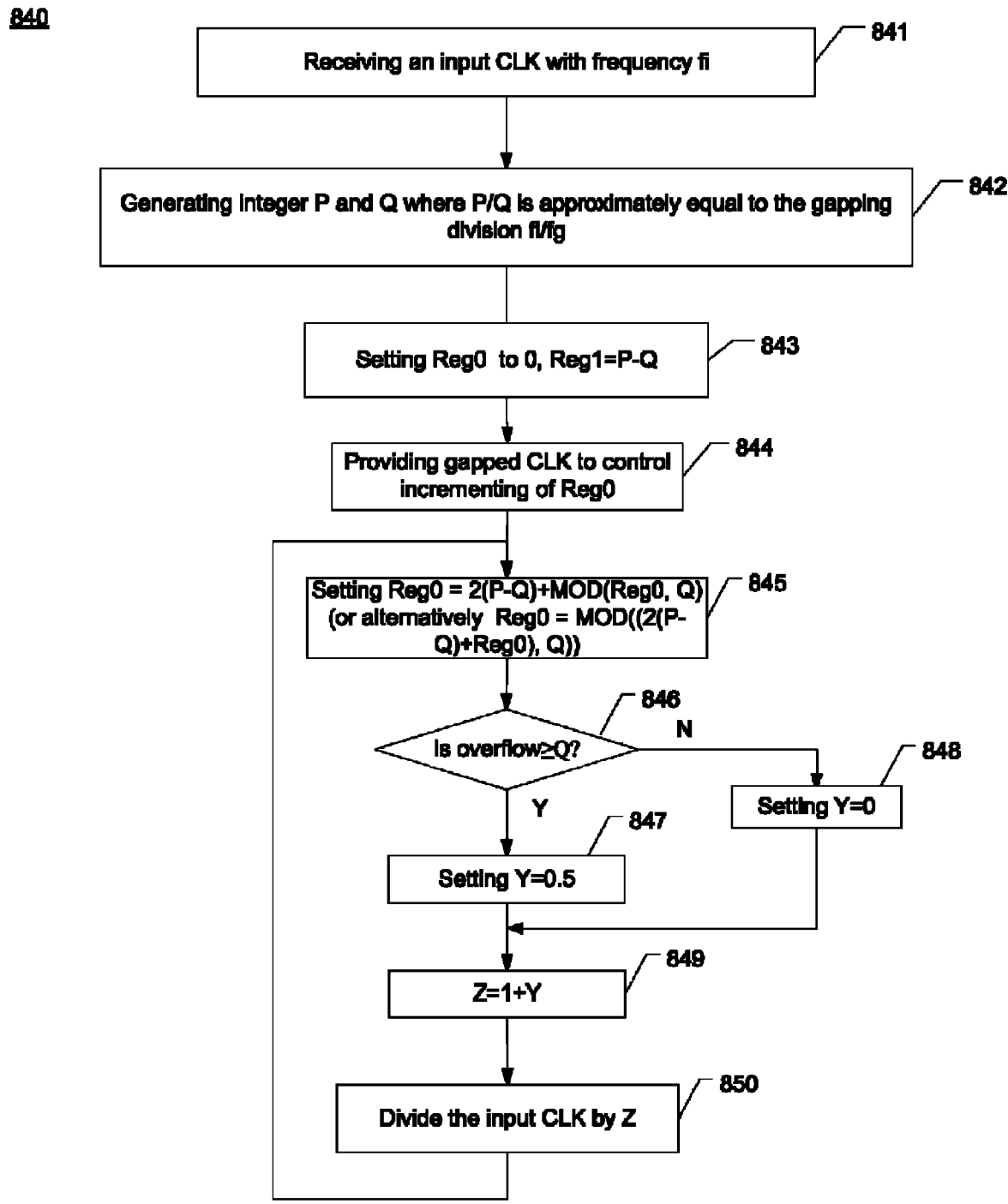
FIG. 8B is a flow diagram depicting an exemplary method of half clock gapping using a gapper that has a similar configuration with FIG. 8A in accordance with an embodiment of the present disclosure.

FIG. 8B is a flow diagram depicting an exemplary method 840 of half clock gapping using a gapper that has a similar configuration with FIG. 8A in accordance with an embodiment of the present disclosure. At 841, the input CLK with $f_i$ is received. P and Q are generated based on the desired divide ratio G of the gapper, where $G=P/Q=f_i/f_{g1}$ and P is greater than Q.

Reg0 is initialized to 0 and Reg1 is set to (P−Q) at 843. The gapped CLK is provided as the clock signal to Reg0 at 844. During each clock cycle of the clock signal, Reg0 is updated with a new value:

$$2(P-Q) + \text{MOD}\left(\frac{Reg0}{Q}\right) \text{ at 845.}$$

If an overflow is detected, compare the overflow with Q at 846. If the overflow is greater than Q during a certain clock cycle, a gapping control signal, Y=0.5 is generated at 848. Otherwise, Y=0 at 847. For each clock cycle, Z is set to 1+Y at 849 and used as the gapping control signal. At 850 the input CLK is divided by a corresponding Z value. The foregoing steps 845-850 are repeated for each clock cycle.

Referring to FIG. 8A and FIG. 8B. For example, $f_i$ is 669.326 MHz, and $f_{g1}$ is 622.08 MHz. P can be set to 255 and Q can be set to 237. The register Reg1 can be set to P−Q=219. The adder performs modulo Q in each clock cycle. When there is an overflow in a certain clock cycle, set Y=½ and so Z=1.5. In response, the multi-modulus divider divides the input CLK by 1.5. Otherwise, Y=0, and so Z=1, and the multi-modulus divider is bypassed and the input CLK is output without modification. In a window of Q=237 output pulses, the multi-modulus divider divides 18×2 times by 1.5, and 237−18×2=201 times by 1. On average, the multi-modulus divider divides by (36×1.5+201×1)/237=255/237, which is equal to P/Q.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. An integrated circuit for frequency synthesis, said integrated circuit comprising:
 a gapper configured to generate a first gapped signal based on an input signal, said gapper comprising a gapping unit configured to generate said first gapped signal that comprises an equivalent of Q pulses responsive to P pulses of said input signal in accordance with a plurality of gapping control signals, wherein P is greater than or equal to Q;
 a frequency divider coupled with said gapper and configured to receive said first gapped signal and generate a second gapped signal; and
 a phase locked loop (PLL) configured to receive said second gapped signal and generate an output signal, wherein, if a frequency ratio of said input signal to said output signal is less than 1, said gapper is configured to incorporate a factor that is greater than 1 from said frequency divider,
 wherein said gapper comprises a multi-modulus divider configured to divide said input signal with a sequence of divide ratios, wherein an average of said divide ratios is approximately equal to P/Q, and wherein said sequence of divide ratio are converted from said plurality of gapping control signals.

2. The integrated circuit of claim 1, further comprising a control unit comprising a Delta Sigma Modulator (DSM) that is configured to generate said plurality of gapping control signals.

3. The integrated circuit of claim 2, wherein said DSM comprises:
 a clock input to receive a clock signal;
 a first register configured to store a first number;
 a second register configured to store a stored value;
 an adder coupled with said first and said second register, wherein said adder is configured to add said first number with said stored value to generate a sum; and
 a modulo component coupled with said adder and configured to generate a remainder of said sum modulo a second number to update said stored value, and to output an overflow,
 wherein said control unit is operable to generate said plurality of gapping control signals based on comparison between overflows and a predetermined value.

4. The integrated circuit of claim 1, wherein said gapping unit is configured to remove a 1/K portion of a pulse from said input signal during a clock cycle in accordance with a gapping control signal, wherein K is a positive integer.

5. The integrated circuit of claim 4, wherein said first number is equal to K(P−Q), and said second number is equal to P, and wherein a respective gapping control signal is generated upon determination that a corresponding overflow is greater than or equal to P.

6. The integrated circuit of claim 4, wherein said first number is equal to 2(P−Q), wherein said second number is equal to Q, wherein said sequence of divide ratios comprises a first divide ratio equal to 1 and a second divide ratio equal to 1.5.

7. The integrated circuit of claim 4, wherein said first number is equal to 2(P−Q), wherein said second number is equal to Q, wherein said sequence of divide ratios comprises a first divide ratio equal to 1.5 and a second divide ratio equal to 2.

8. The integrated circuit of claim 1, wherein said gapping unit is operable to remove a half pulse during a clock cycle in accordance with a respective gapping control signal.

9. The integrated circuit of claim 1, wherein said gapping unit is operable to remove at least one pulse during a clock cycle in accordance with a respective gapping control signal.

10. A method of frequency synthesis comprising:
 receiving an input signal at a multi-modulus divider;
 generating a first gapped signal based on the input signal;
 dividing said first gapped signal with a first divide ratio to generate a second gapped signal; and generating an output signal based on said second gapped signal, comprising:

setting a value of a first register to zero and setting a value of a second register to P−Q, wherein said first gapped signal comprises an equivalent of Q pulses corresponding to P pulses in said input signal, wherein P and Q are integers and P is greater than Q;

updating a value of the first register using the second gapped signal;

detecting an overflow in the updated value, and:
  if the overflow is less than Q, setting a control value Y to 0; and
  if the overflow is greater than or equal to Q, setting the control value Y to a divide value greater than 0;

incrementing the value of Y by 1; and dividing the clock signal by Y to generate an output signal having at least a portion of at least one pulse removed.

11. The method of claim 10, wherein updating a value of the first register comprises using a multiplication component and an adder.

12. The method of claim 11, wherein updating a value of the first register comprises setting a value of the first register to (P−Q)+MOD(Reg0, P), wherein Reg0 is a present value of the first register.

13. The method of claim 11, wherein updating a value of the first register comprises setting a value of the first register to 2(P−Q)+MOD(Reg0, Q), wherein Reg0 is a present value of the first register.

14. The method of claim 10, wherein the divide value is equal to 1.

15. The method of claim 10, wherein the divide value is equal to 0.5.

16. The method of claim 10, further comprising using a DSM and a control signal generator to generate gapping control signals to control a rate of gap generation by the multi-modulus divider.

17. The method of claim 10, wherein the first gapped signal serves as the clock signal for the DSM and is provided to the first register.

18. The method of claim 10, wherein setting the control value Y equal to 0 bypasses the multi-modulus divider.

* * * * *